(12) United States Patent
Bieling et al.

(10) Patent No.: US 10,599,041 B2
(45) Date of Patent: Mar. 24, 2020

(54) FACET MIRROR

(71) Applicant: Carl Zeiss SMT GmbH, Oberkochen (DE)

(72) Inventors: Stig Bieling, Aalen (DE); Markus Deguenther, Aalen (DE); Johannes Wangler, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 922 days.

(21) Appl. No.: 14/529,844

(22) Filed: Oct. 31, 2014

(65) Prior Publication Data
US 2015/0049321 A1 Feb. 19, 2015

Related U.S. Application Data

(63) Continuation of application No. PCT/EP2013/059427, filed on May 7, 2013.
(Continued)

(30) Foreign Application Priority Data

May 23, 2012 (DE) .................. 10 2012 010 093

(51) Int. Cl.
*G03B 27/54* (2006.01)
*G03F 7/20* (2006.01)
(Continued)

(52) U.S. Cl.
CPC ....... *G03F 7/70191* (2013.01); *G02B 5/0891* (2013.01); *G02B 5/1861* (2013.01);
(Continued)

(58) Field of Classification Search
CPC .............. G02B 17/002; G02B 19/0023; G02B 19/0047; G02B 19/0095; G02B 5/0284;
(Continued)

(56) References Cited

U.S. PATENT DOCUMENTS

| 5,581,605 A | * | 12/1996 | Murakami | ............. | B82Y 10/00 |
| | | | | | 359/619 |
| 6,573,978 B1 | * | 6/2003 | McGuire, Jr. | ....... | G03F 7/70075 |
| | | | | | 355/71 |

(Continued)

FOREIGN PATENT DOCUMENTS

CN          1 985 356 A      6/2007
DE   10 2006 036 064 A1      2/2008
(Continued)

OTHER PUBLICATIONS

International Search Report for corresponding PCT Appl. No. PCT/EP2013/059427, dated Aug. 16, 2013.
(Continued)

*Primary Examiner* — Christina A Riddle
(74) *Attorney, Agent, or Firm* — Fish & Richardson P.C.

(57) ABSTRACT

Illumination optical unit for illuminating an object field in a projection exposure apparatus, comprising a first facet mirror with a structure, which has a spatial frequency of at least 0.2 mm$^{-1}$ in at least one direction, and a second facet mirror, comprising a multiplicity of facets, wherein the facets are respectively provided with a mechanism for damping spatial frequencies of the structure of the first facet mirror.

24 Claims, 9 Drawing Sheets

Related U.S. Application Data

Figure 1:
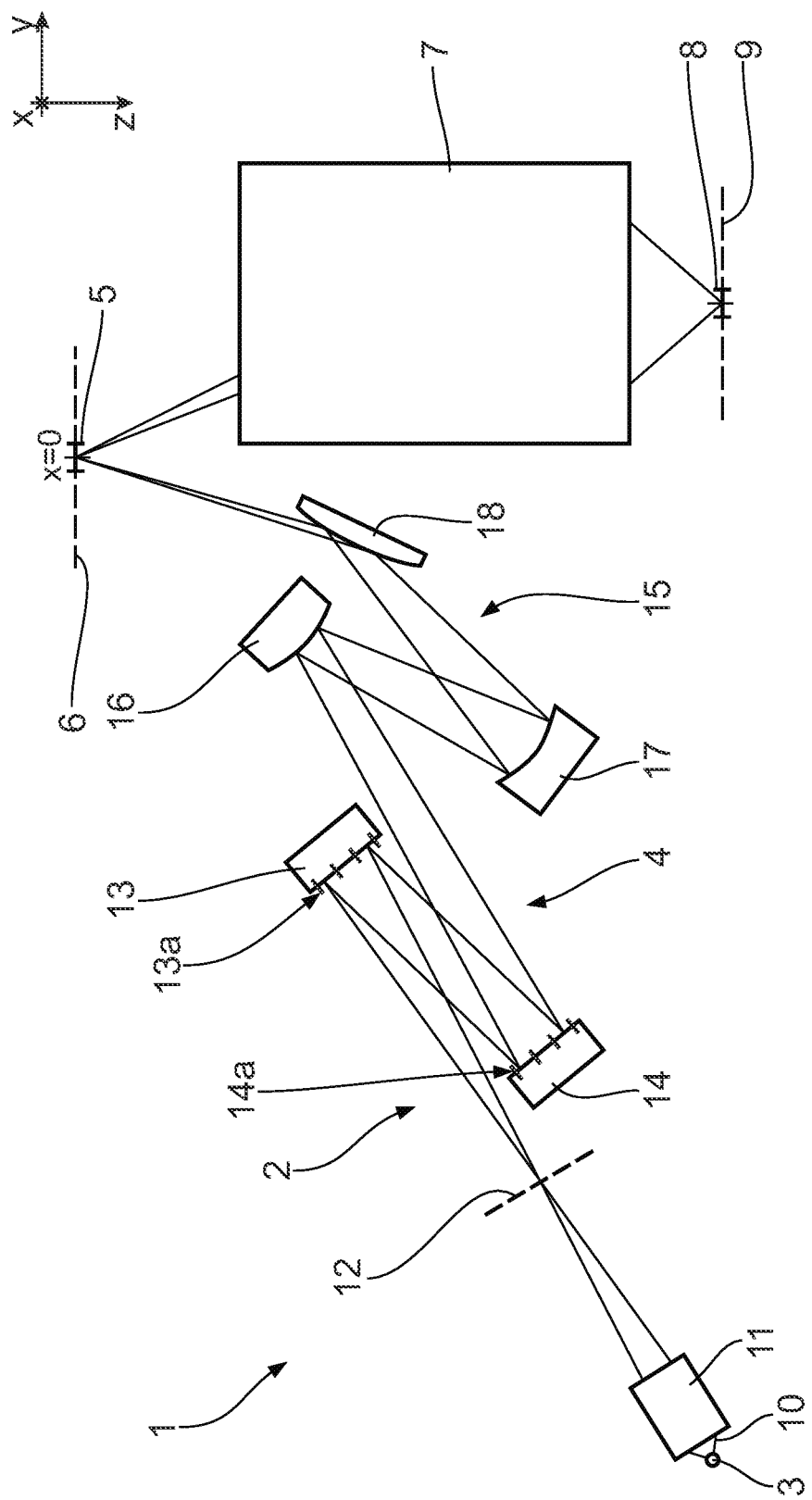

(60) Provisional application No. 61/650,568, filed on May 23, 2012.

(51) Int. Cl.
*G02B 19/00* (2006.01)
*G02B 17/00* (2006.01)
*G02B 5/08* (2006.01)
*G02B 5/18* (2006.01)

(52) U.S. Cl.
CPC ....... *G02B 17/002* (2013.01); *G02B 19/0023* (2013.01); *G02B 19/0047* (2013.01); *G02B 19/0095* (2013.01); *G03F 7/702* (2013.01); *G03F 7/70075* (2013.01); *G03F 7/70575* (2013.01)

(58) Field of Classification Search
CPC ...... G02B 5/0891; G02B 5/09; G02B 5/1861; G02B 5/02; G02B 5/0205; G02B 5/0257; G02B 5/021; G02B 5/0263; G03F 7/70075; G03F 7/70191; G03F 7/702; G03F 7/70575; G03F 7/70083; G03F 7/70091; G03F 7/70125; G03F 7/7015; G03F 7/70158; G03F 7/7055; G03F 7/70958
USPC ......... 355/52, 53, 55, 67–71, 77; 250/492.1, 250/492.2, 492.22, 493.1, 548; 359/601, 359/605, 606, 850, 853, 864, 904, 599
See application file for complete search history.

(56) References Cited

U.S. PATENT DOCUMENTS

| | | | |
|---|---|---|---|
| 6,859,515 | B2 | 2/2005 | Schultz et al. |
| 7,006,595 | B2 | 2/2006 | Singer et al. |
| 7,319,509 | B2 | 1/2008 | Singer |
| 7,800,734 | B2 | 9/2010 | Komatsuda |
| 2001/0046073 | A1 | 11/2001 | Kathman et al. |
| 2003/0086524 | A1* | 5/2003 | Schultz ............... B82Y 10/00 378/34 |
| 2005/0024614 | A1 | 2/2005 | Bakker |
| 2005/0030653 | A1* | 2/2005 | Holderer ............... G02B 5/09 359/872 |
| 2005/0236585 | A1 | 10/2005 | Miyake |
| 2005/0275818 | A1 | 12/2005 | Singer |
| 2007/0132977 | A1* | 6/2007 | Komatsuda ........ G02B 17/002 355/60 |
| 2008/0013680 | A1 | 1/2008 | Singer et al. |
| 2008/0278704 | A1 | 11/2008 | Endres et al. |
| 2009/0002662 | A1 | 1/2009 | Komatsuda |
| 2009/0267003 | A1 | 10/2009 | Moriya et al. |
| 2011/0001947 | A1 | 1/2011 | Dinger et al. |
| 2011/0222042 | A1* | 9/2011 | Iizuka ................. G02B 5/1814 355/71 |
| 2011/0223543 | A1 | 9/2011 | Banine et al. |
| 2012/0262688 | A1 | 10/2012 | DeVries et al. |

FOREIGN PATENT DOCUMENTS

| | | |
|---|---|---|
| DE | 10 2008 009 600 A1 | 8/2009 |
| DE | 10 2009 044 462 A1 | 1/2011 |
| DE | 10 2011 082 065 A1 | 9/2012 |
| DE | 10 2012 209 882 A1 | 6/2013 |
| EP | 1 225 481 A2 | 7/2002 |
| EP | 1 796 147 A1 | 6/2007 |
| EP | 1 811 547 A1 | 7/2007 |
| JP | 2005/049845 | 2/2005 |
| JP | 2005/536900 | 2/2005 |
| JP | 2005/302998 | 10/2005 |
| JP | 2005-302998 | 10/2005 |
| JP | 2010/004002 | 1/2010 |
| JP | 2010-114344 A | 5/2010 |
| JP | 2010/153871 | 7/2010 |
| JP | 4518078 B2 | 8/2010 |
| JP | 2011/523782 | 8/2011 |
| TW | 530 164 B | 5/2003 |
| TW | 200 406 822 A | 5/2004 |
| TW | I318776 B | 12/2009 |
| WO | WO 2004/021086 A1 | 3/2004 |
| WO | WO 2009/069815 A1 | 6/2009 |
| WO | WO 2009/100856 A1 | 8/2009 |

OTHER PUBLICATIONS

Chinese office action, with English translation thereof, corresponding to CN Appl No. 2013 8002 6836.2, dated Jul. 4, 2016.
Japanese Office Action, with English translation thereof for corresponding JP Appln. No. 2015-513078, dated Apr. 11, 2017.
Chinese office action and Search Report, with English translation, for corresponding CN application No. 2013 8002 6836.2, dated May 31, 2017.
German Office Action, with translation thereof, for DE Appl No. 10 2012 010 093.0, dated Nov. 2, 2012.
Taiwanese office action, with English translation, for corresponding Appl No. 102 117 653, dated Mar. 15, 2017.
Taiwanese office action and search report, with English translation thereof, for corresponding TW Appl No. 102 117 653, dated Feb. 22, 2018.
Japanese office action, with English translation thereof, for corresponding JP Appl No. 2015-513078, dated Feb. 20, 2018.

\* cited by examiner

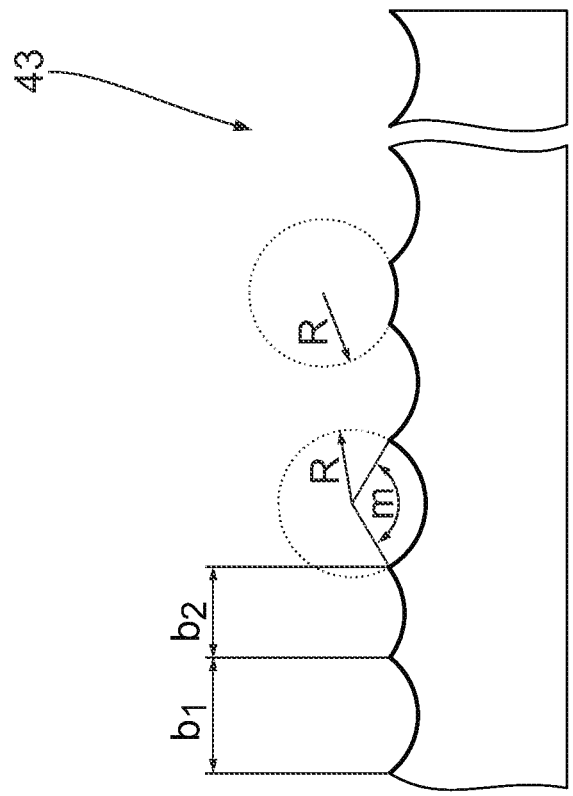
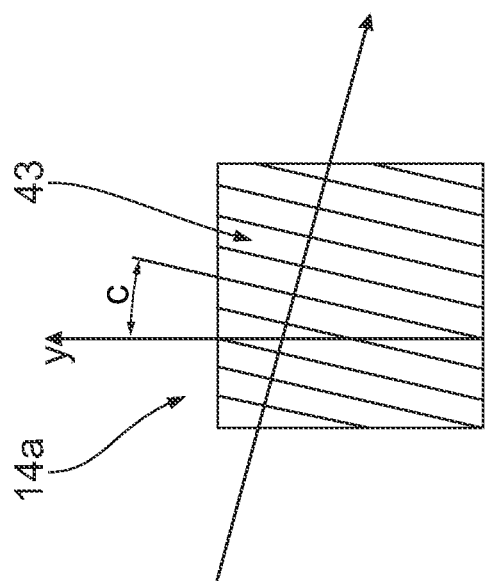
Fig. 14

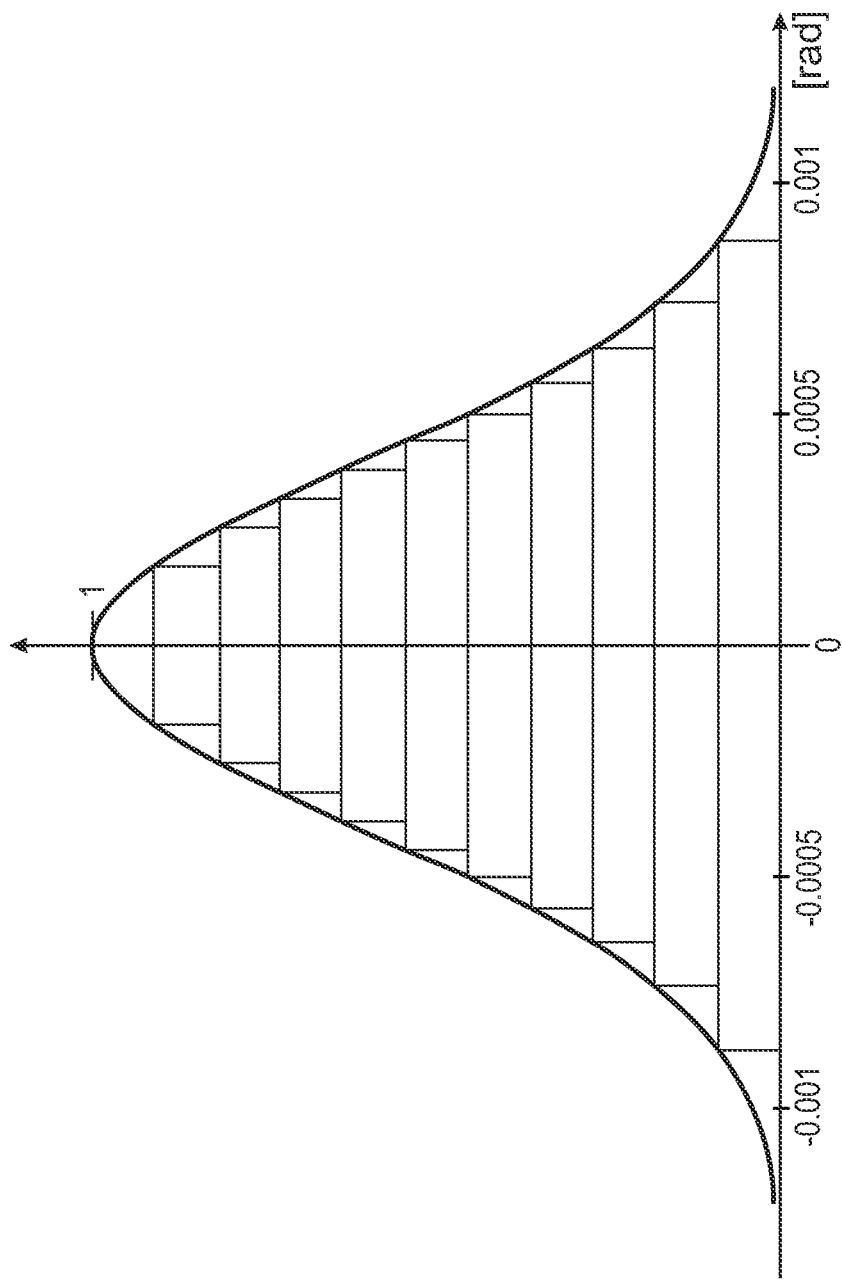

FACET MIRROR

CROSS-REFERENCE TO RELATED APPLICATIONS

The present application is a continuation of, and claims benefit under 35 USC 120 to, international application PCT/EP2013/059427, filed May 7, 2013, which claims benefit under 35 USC 119 of German Application No. 10 2012 010 093.0, filed May 23, 2012. International application PCT/EP2013/059427 also claims priority under 35 USC 119(e) to U.S. Provisional Application No. 61/650,568, filed May 23, 2012. The entire disclosure of international application PCT/EP2013/059427 and German Application No. 10 2012 010 093.0 are incorporated by reference herein.

The invention relates to a facet mirror for an illumination optical unit of a projection exposure apparatus. The invention furthermore relates to an illumination optical unit for illuminating an object field in a projection exposure apparatus. The invention moreover relates to an illumination system for a projection exposure apparatus and a projection exposure apparatus with such an illumination system. Finally, the invention relates to a method for producing a microstructured or nanostructured component and a component produced according to the method.

A mirror array for use in a projection exposure apparatus for microlithography is known, for example, from WO 2009/100856 A1. There always is a need for further development of the components of such a projection exposure apparatus.

A first object of the invention consists of improving a facet mirror for an illumination optical unit of a projection exposure apparatus. This object is achieved by a facet mirror for an illumination optical unit of an projection exposure apparatus, comprising a multiplicity of facets, in which the facets are respectively provided with a mechanism for damping spatial frequencies above a specific limit frequency.

In accordance with one aspect of the invention, the facet mirror comprises a multiplicity of facets, which are respectively provided with a mechanism for damping spatial frequencies above a specific limit frequency. Such a facet mirror can, in particular, be used as a pupil facet mirror. It renders it possible to damp microstructures of the field facet mirror, which have a negative effect on the uniformity of the mask illumination in the object field. Such a facet mirror with a mechanism for damping spatial frequencies also leads to a stabilization of the optical system with respect to source variations and system tolerances.

Targeted defocusing of the pupil facets can serve as a mechanism for damping spatial frequencies. This can be achieved by a suitable selection of the radii of curvature of the pupil facets.

Use can also be made of toroidal pupil facets. These are preferably configured in such a way that the refractive power in the scanning direction precisely satisfies the fly's eye condenser condition. This should be understood to mean that the intermediate focus is precisely imaged on the pupil facets and the field facets are precisely imaged on the reticle, at least in one spatial direction. The result of this is that a displacement of the radiation source does not lead to parallaxes in the field illumination. The toroidal pupil facets can introduce the desired defocus in a direction perpendicular to the scanning direction.

The facets for damping spatial frequencies are preferably provided with a suitable scattering function. The scattering function is preferably a one-dimensional scattering function. It is selected in a suitable manner for influencing the illumination of the object field in the cross-scan direction only.

A Gaussian function with a scattering angle $\sigma$ of approximately 0.4 mrad was found to be advantageous for the angular distribution of the scattered intensity. This renders it possible to damp spatial frequencies of more than 1.33 $mm^{-1}$ to less than 0.01% contrast. In general, the scattering function has a scattering angle $\sigma$ of at least 0.1 mrad, in particular at least 0.2 mrad, in particular at least 0.3 mrad.

Such a scattering function can be brought about by writing one-dimensional cylinders into the pupil facets. The facets therefore have a reflection surface, which is composed of cylindrical surface sections. The cylindrical surface sections preferably have the same alignment in each case. They moreover have the same radius of curvature in each case. However, they have different widths, i.e. different central angles. As a result of this, it is possible to approximate the sought-after scattering function very well. It is also possible to embody the cylindrical surface sections with different radii of curvature and identical widths or with both different radii of curvature and different widths. The orientation of the cylinders can be set arbitrarily. It depends, inter alia, on the geometrical field rotation in the fly's eye condenser.

It is also possible to introduce a targeted power spectral density (PSD) onto the surface of the facets. To this end, the surface of the facets is roughened in an anisotropic fashion. As a result, it is possible to obtain a desired bidirectional reflectance distribution function (BRDF). Here, the coherence of the illumination radiation, in particular of the EUV radiation, should be taken into account.

In accordance with a further aspect of the invention, the facet mirror comprises a multiplicity of facets, which are respectively provided with a diffraction structure for diffracting radiation with a wavelength in the infrared region. The facets can be provided with, in particular, a binary phase grating. The phase grating preferably has a groove depth which just corresponds to a quarter of a wavelength to be blocked out. In particular, the groove depth d lies in the region from 2 μm to 3 μm, in particular in the region from 2.5 μm to 2.7 μm, preferably about 2.65 μm. The diffraction structure has a grating period p of at most 5 mm, in particular at most 3 mm, in particular at most 2 mm, in particular at most 1 mm. Here, a smaller grating period results in a larger deflection angle for the first order of diffraction. The deflection angle is, in particular, at least 3 mrad, in particular at least 5 mrad.

In principle, the facets can also have a multi-grating structure, in particular with different grating constants. This renders it possible to cancel different wavelengths. For more details, reference is made to DE 10 2009 044 462 A1.

The facets can be composed of a multiplicity of micromirrors. It is also possible to configure the facets in such a way that in each case an individual facet is suitable for illuminating the whole object field.

The object is further achieved by a facet mirror for an illumination optical unit of a projection exposure apparatus, comprising a multiplicity of facets, wherein the facets are respectively provided with at least one diffraction structure for diffracting radiation with a wavelength in the infrared region, and wherein the diffraction structure has a grating period of at most 5 mm A further object of the invention consists of improving an illumination optical unit for illuminating an object field in a projection exposure apparatus. This object is achieved by an illumination optical unit for illuminating an object field in a projection exposure apparatus, comprising a first facet mirror and a second facet mirror as described above, wherein the first facet mirror has a structure, at least in regions, which has a spatial frequency of at least 0.2 mm$^{-1}$ in at least one direction.

The core of the invention consists of combining a first facet mirror, which has a structure with a spatial frequency of at least 0.2 mm$^{-1}$, in particular at least 0.3 mm$^{-1}$, in particular at least 0.5 mm$^{-1}$, in particular at least 1 mm$^{-1}$, with a second facet mirror with facets which are respectively provided with a mechanism for damping spatial frequencies above a specific limit frequency.

Such a combination of two facet mirrors is particularly advantageous. Thus the radiation used to illuminate the object field can be guided in a very flexible fashion via the first facet mirror, while the embodiment of the second facet mirror serves to enable an illumination of the object field with high uniformity.

The first facet mirror is preferably provided with a binary phase grating for diffracting radiation with a wavelength in the infrared region. In this respect, reference is made to the description above.

The two facet mirrors are preferably matched to one another in such a way that the a mechanism for damping the spatial frequencies of the facets of the second facet mirror just lead to the spatial frequencies of the structure of the first facet mirror having a contrast of at most 1% in the region of the object field.

The first facet mirror is, in particular, provided with a binary phase grating for blocking out radiation in the infrared region. Here, the phase grating preferably has a groove depth d which just corresponds to a quarter of a wavelength to be blocked out.

The binary phase grating preferably has a grating period p which is matched to the configuration of the facets of the second facet mirror in such a way that the first and minus first order of diffraction of radiation with a wavelength to be blocked out is imaged on facets of the second facet mirror, which facets lie adjacent to a facet on which the image of imaging radiation comes to rest. The pupil facets on which the first and minus first order of diffraction of the radiation to be blocked is imaged are aligned in such a way, in particular tilted in such a way, that the radiation to be blocked is not imaged in the object field. In particular, the radiation to be blocked can be deflected to a light trap.

A further object of the invention consists of improving an illumination system for a projection exposure apparatus, in particular for an EUV projection exposure apparatus, and such a projection exposure apparatus for microlithography.

These objects are achieved by an illumination system for an EUV projection exposure apparatus, comprising an illumination optical unit as described above and an EUV radiation source, and by a projection exposure apparatus for microlithography, comprising an illumination optical unit as described above. The advantages correspond to those described above.

Further objects of the invention consist of improving a method for producing a microstructured or nanostructured component and such a component. These objects are achieved by a method for producing a microstructured or nanostructured component, comprising the following steps: providing a substrate, on which a layer made of a light-sensitive material is applied at least in part, providing a reticle, which has structures to be imaged, providing a projection exposure apparatus as described above, and projecting at least part of the reticle onto a region of the light-sensitive layer of the substrate with the aid of the projection exposure apparatus, and by a component produced by the method. In respect of the advantages, reference is once again made to the description above.

Figure 2:
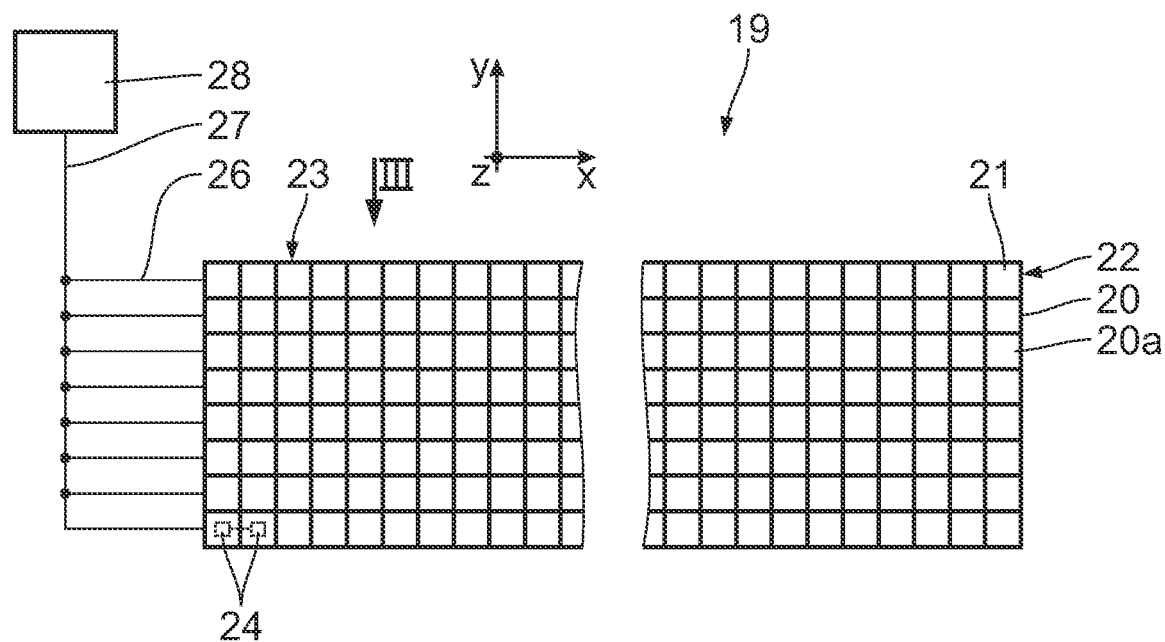
Figure 3:
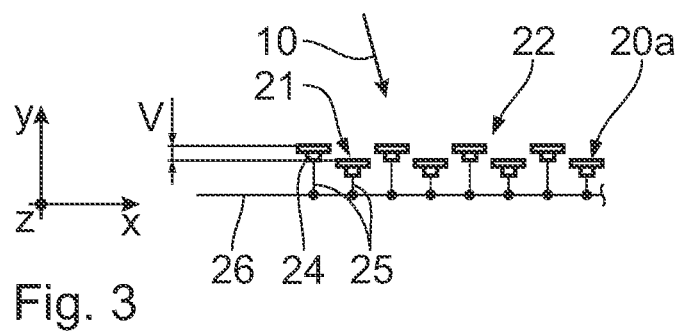
Figure 5:
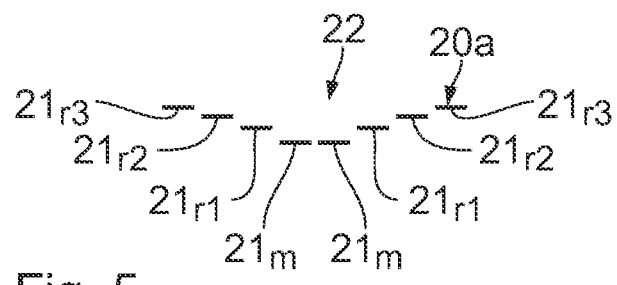
Figure 6:
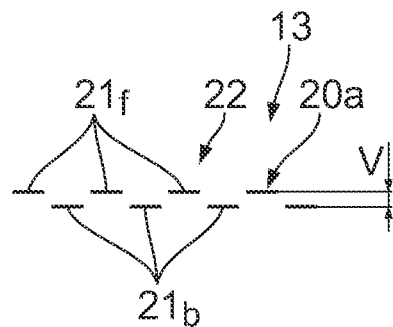
Figure 7:
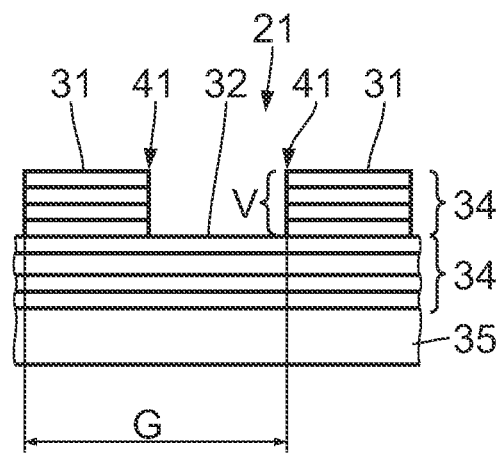
Figure 8:
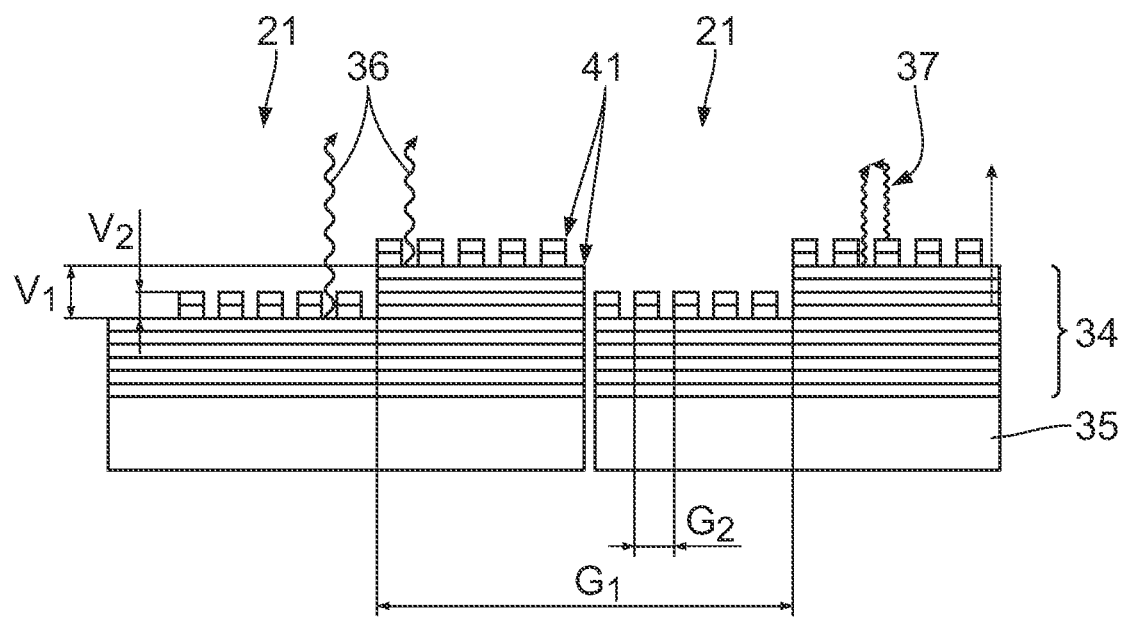
Figure 9:
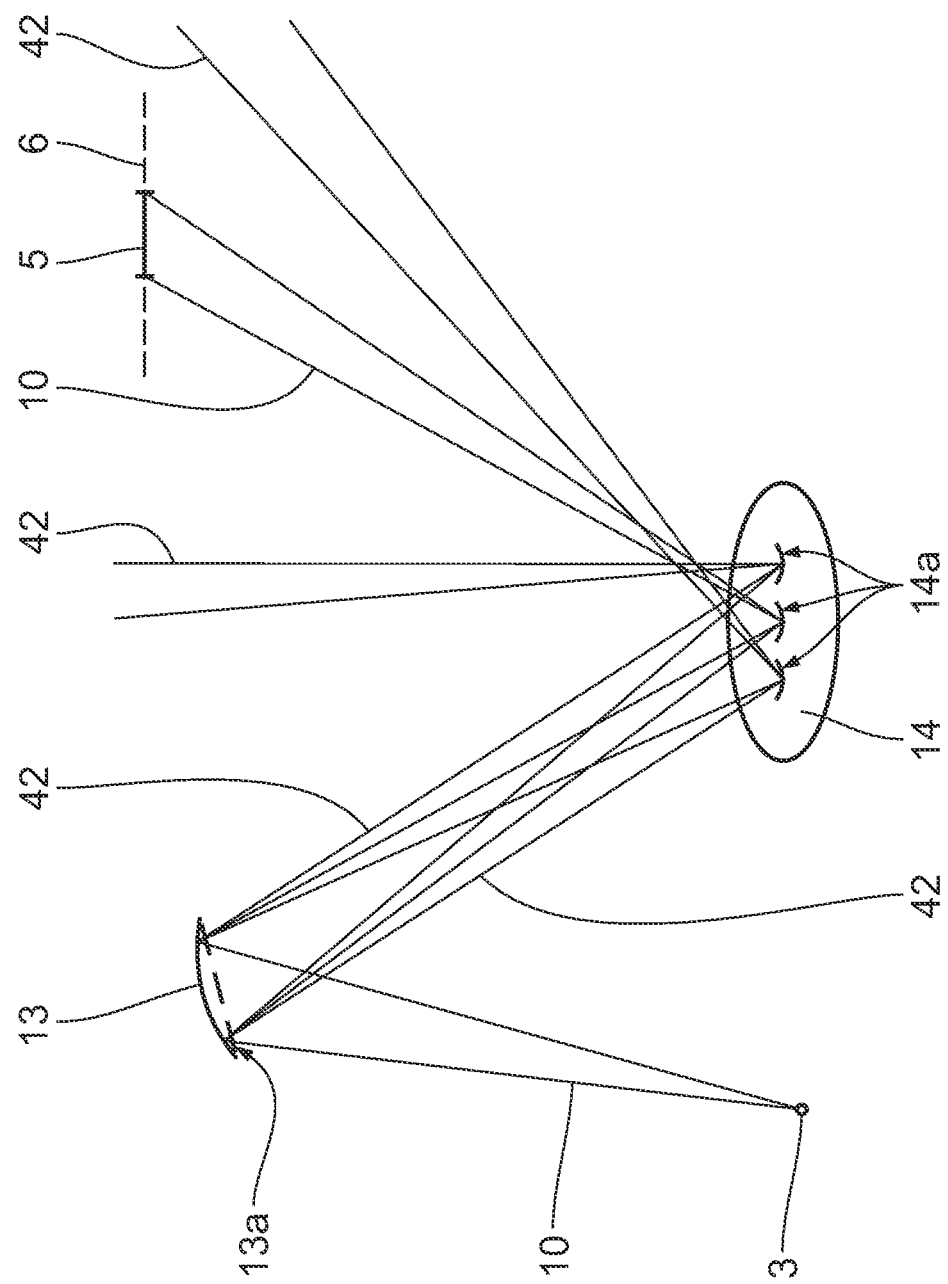
Figure 10:
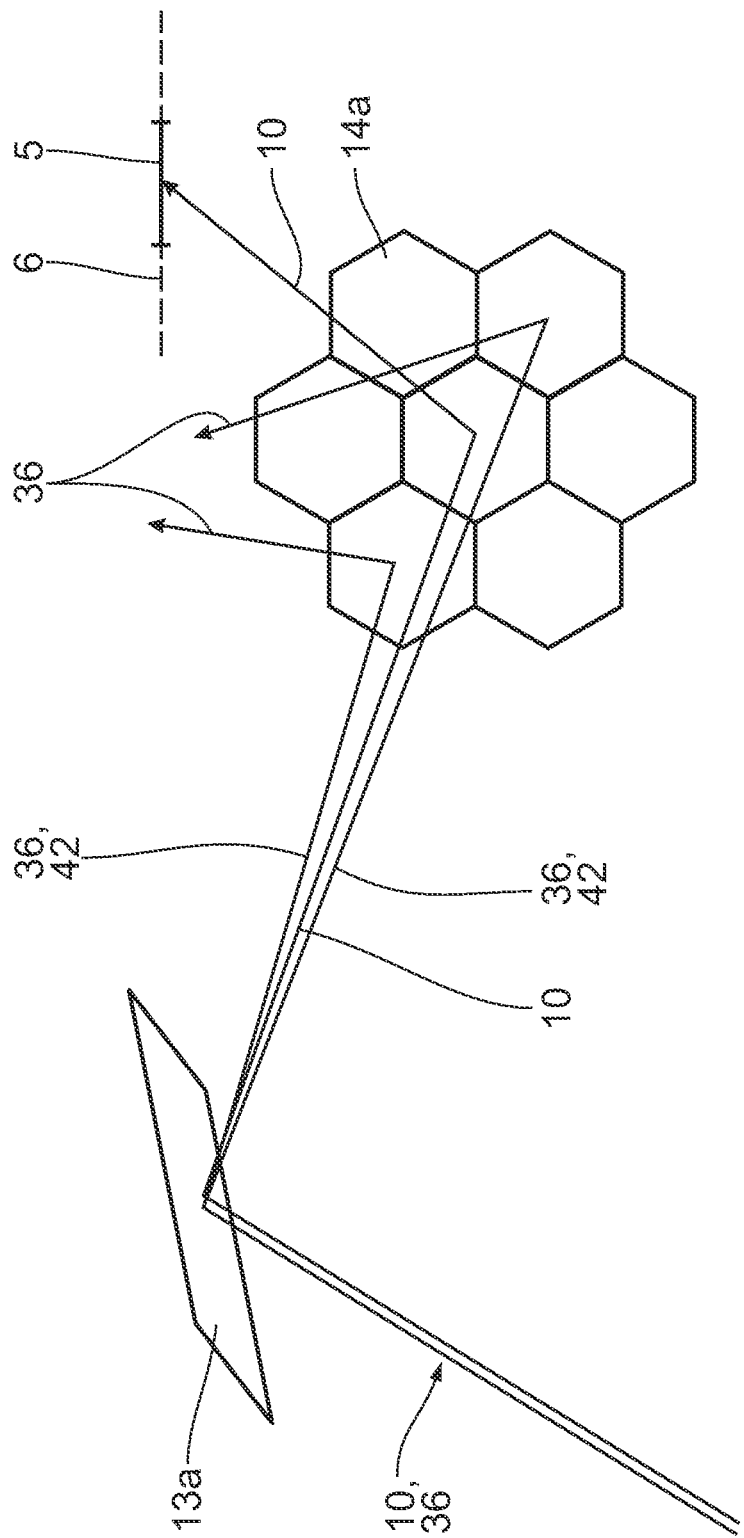
Figure 11:
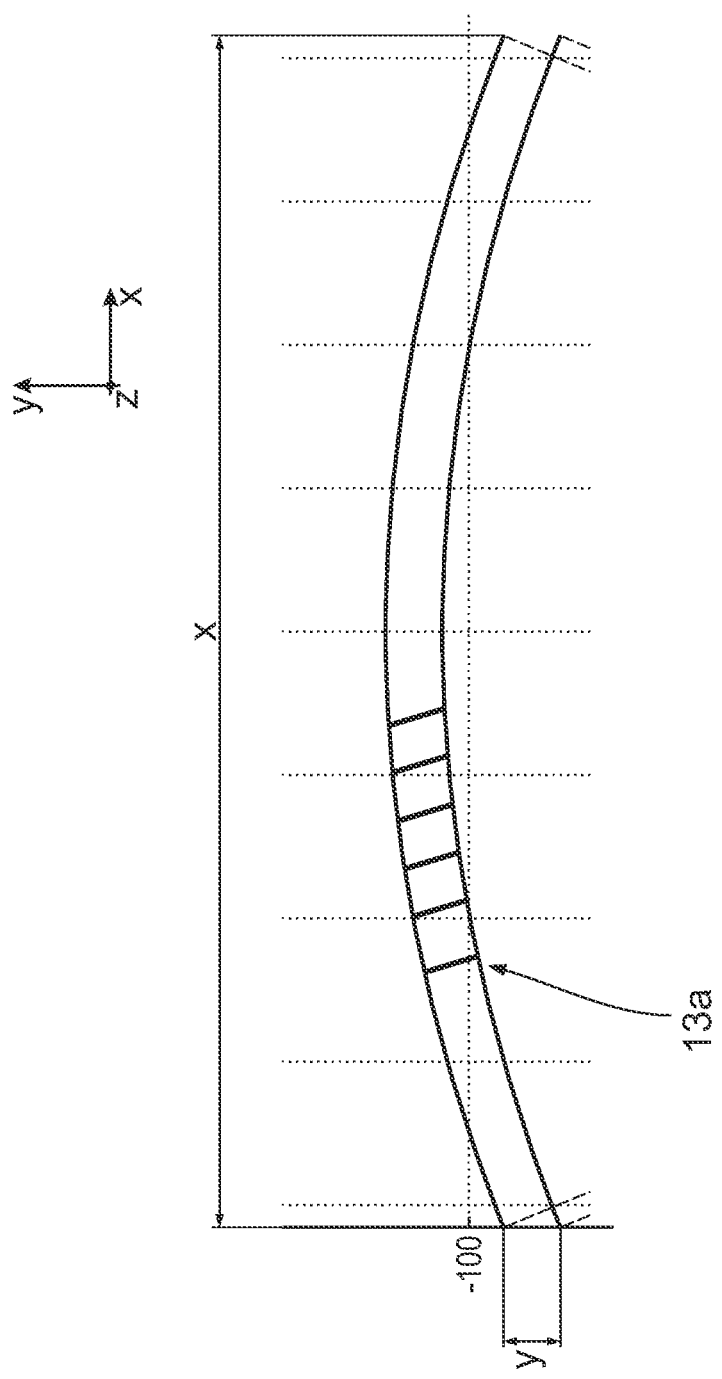
Figure 12:
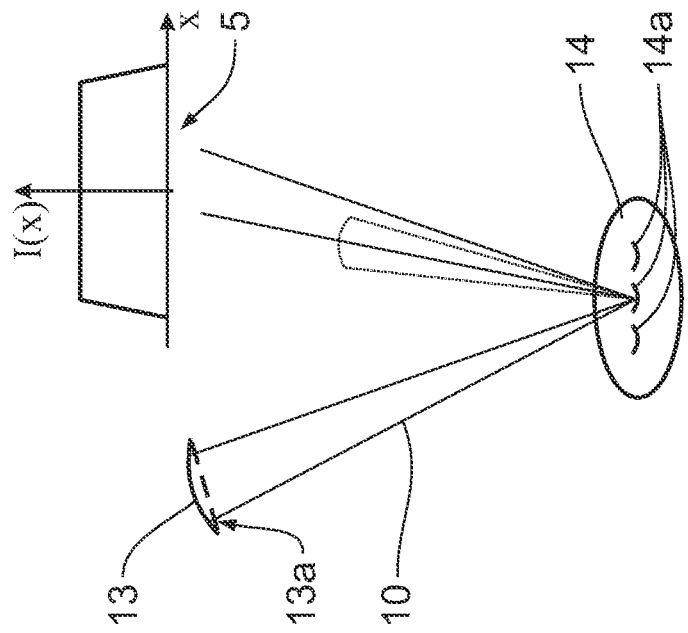
Figure 13:
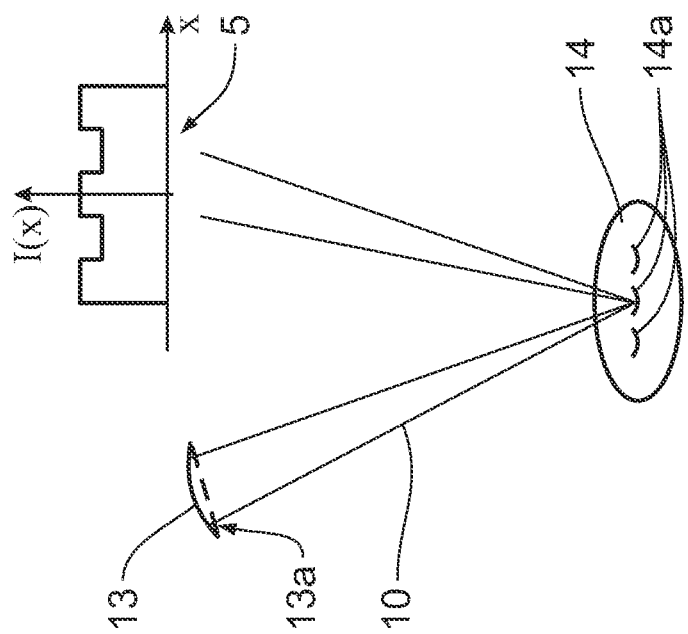

Further advantages, features and details of the invention emerge from the description of a plurality of exemplary embodiments on the basis of the drawings. In detail:

FIG. 1 schematically shows a meridional section through a projection exposure apparatus for EUV projection lithography, FIG. 2 schematically shows a top view of a section of a field facet mirror which is made up of individual mirrors and designed for use in the projection exposure apparatus according to FIG. 1, FIG. 3 shows a view of a section of an individual mirror row of the facet mirror according to FIG. 2 from the viewing direction III in FIG. 2, FIGS. 4 to 6 very schematically show, in various different configurations, different forms of a row reflection surface formed from the individual mirrors of the individual mirror row illustrated in FIG. 3, FIG. 7 schematically shows an illustration of the structural design of a facet of a field facet mirror in accordance with one exemplary embodiment, FIG. 8 schematically shows an illustration of the structural design of a facet of a field facet mirror in accordance with a further exemplary embodiment, FIGS. 9 and 10 show schematic illustrations of the beam path in an illumination optical unit in accordance with an exemplary embodiment, with a field facet mirror with a diffraction structure for diffracting radiation with a wavelength in the infrared region, FIG. 11 shows a schematic illustration of a facet with a phase grating, FIGS. 12 and 13 show schematic illustrations for clarifying the effect of a scattering function on a pupil facet, FIG. 14 shows schematic illustrations of the design of the reflection surface of a field facet in accordance with an exemplary embodiment and FIG. 15 shows a schematic illustration of a Gaussian scattering function through N=10 cylinders.

The general design of a projection exposure apparatus 1 for microlithography is first of all described.

In a meridional section, FIG. 1 schematically shows a projection exposure apparatus 1 for microlithography. In addition to a radiation source 3, an illumination system 2 of the projection exposure apparatus 1 comprises an illumination optical unit 4 for exposing an object field 5 in an object plane 6. What is exposed in this case is a reticle which is arranged in the object field 5, is not illustrated in the drawing and is held by a reticle holder (likewise not illustrated). A projection optical unit 7 serves to image the object field 5 in an image field 8 in an image plane 9. A structure on the reticle is imaged on a light-sensitive layer of a wafer which is arranged in the region of the image field 8 in the image plane 9, is likewise not illustrated in the drawing and is held by a wafer holder (likewise not illustrated).

The radiation source 3 is an EUV radiation source with an emitted used radiation in the region between 5 nm and 30 nm. Here, this can be a plasma source, for example a GDPP source (gas discharge-produced plasma) or an LPP source (laser-produced plasma). By way of example, tin can be excited to form plasma via a carbon dioxide laser operating at a wavelength of 10.6 μm, i.e. in the infrared region. A radiation source which is based on a synchrotron can also be used as a radiation source 3. By way of example, a person skilled in the art finds information in respect of such a radiation source in U.S. Pat. No. 6,859,515 B2. EUV radiation 10, which is emitted by the radiation source 3, is focused by a collector 11. A corresponding collector is known from EP 1 225 481 A. After the collector 11, the EUV radiation 10 propagates through an intermediate focus plane 12, before it is incident on a field facet mirror 13 with a multiplicity of field facets 13a. The field facet mirror 13 is arranged in a plane of the illumination optical unit 4 which is optically conjugate to the object plane 6.

In the following text, the EUV radiation 10 is also referred to as illumination light or imaging light.

After the field facet mirror 13, the EUV radiation 10 is reflected by a pupil facet mirror 14 with a multiplicity of pupil facets 14a. The pupil facet mirror 14 is arranged in a pupil plane of the illumination optical unit 4 which is optically conjugate to a pupil plane of the projection optical unit 7. With the aid of the pupil facet mirror 14 and an imaging optical assembly in the form of a transmission optical unit 15 with mirrors 16, 17 and 18, denoted in the sequence of the beam path, field individual facets 19, which are also referred to as subfields or as individual mirror groups and which will still be described in more detail below, of the field facet mirror 13 are imaged in the object field 5. The last mirror 18 of the transmission optical unit 15 is a grazing-incidence mirror.

In order to simplify the description of positional relations, a Cartesian xyz-coordinate system is plotted in FIG. 1 as a global coordinate system for the description of the positional relations of components of the projection exposure apparatus 1 between the object plane 6 and the image plane 9. In FIG. 1, the x-axis extends perpendicular to the plane of the drawing and into the latter. The y-axis extends toward the right in FIG. 1. In FIG. 1, the z-axis extends downward, i.e. perpendicular to the object plane 6 and to the image plane 9.

FIG. 2 shows details of the design of the field facet mirror 13 in a very schematic illustration. An overall reflection surface 20 of the field facet mirror 13 is subdivided into rows and columns to form a grid of mirror elements referred to below as an individual mirror 21. The field facet mirror 13 is therefore designed as a mirror array with a multiplicity of individual mirrors 21. The individual mirrors 21 respectively have an individual reflection surface 20a. For the purposes of reflecting the EUV radiation 10, the individual mirrors 21 have a coating with a multi-layer system 34. In accordance with a first exemplary embodiment, the multi-layer system 34 of the individual mirrors 21 has a uniform thickness. This in particular makes it easier to produce the individual mirrors 21 and therefore leads to a reduction in costs.

The individual reflection surfaces 20a of each of the individual mirrors 21 are planar, at least in sections. At least some of the individual mirrors 21 can also have an individual reflection surface 20a with a completely planar design. It is also possible that all individual mirrors 21 have an individual reflection surface 20a with a completely planar design. An individual mirror row 22 has a plurality of the individual mirrors 21 lying directly next to one another. Several ten to several hundred of the individual mirrors 21 can be provided in an individual mirror row 22. The individual mirrors 21 are square in the example according to FIG. 2. Other shapes of individual mirrors, which allow occupancy of the overall reflection surface 20 with as few gaps as possible, can also be used. Such alternative individual mirror shapes are known from the mathematical theory of tessellation.

By way of example, the field facet mirror 13 can be configured as described in DE 10 2006 036 064 A1.

Depending on the embodiment of the field facet mirror 13, an individual mirror column 23 likewise has a plurality of individual mirrors 21. By way of example, several tens of individual mirrors 21 are provided per individual mirror row 23.

In order to simplify the description of positional relations, a Cartesian xyz-coordinate system is plotted in FIG. 2 as a local coordinate system of the field facet mirror 13. Corresponding local xyz-coordinate systems are also found in the following figures which show facet mirrors or a section thereof in a top view. In FIG. 2, the x-axis extends horizontally to the right, parallel to the individual mirror rows 22. In FIG. 2, the y-axis extends upward, parallel to the individual mirror columns 23. The z-axis is perpendicular to the plane of the drawings of FIG. 2 and extends out of the latter.

During the projection exposure, the reticle holder and the wafer holder are scanned in the y-direction, synchronized with respect to one another. A small angle between the scanning direction and the y-direction is also possible. In the x-direction, the overall reflection surface 20 of the field facet mirror 13 has an extent of $x_0$. In the y-direction, of the overall reflection surface 20 of the field facet mirror 13 has an extent of $y_0$.

Depending on the embodiment of the field facet mirror 13, the individual mirrors 21 have x/y extents in the region of, for example, 600 μm×600 μm to, for example 2 mm×2 mm. In particular, these are so-called micro-mirrors. The micromirrors can also have dimensions and/or an arrangement on the field facet mirror 13 in such a way that they form a diffraction structure for radiation in a predetermined wavelength region. In particular, they can be configured and/or arranged in such a way that they form a diffraction structure for radiation in the infrared wavelength region, in particular for radiation with a wavelength of 10.6 μm. To this end, they can, in particular, have dimensions which lie in the region of the wavelengths to be diffracted, in particular in the infrared region, in particular in the region from 780 nm to 1 mm. The individual mirrors 21 can be shaped in such a way that they have a focusing effect on the illumination light 10. Such a focusing effect of the individual mirrors 21 is particularly advantageous when using a divergent illumination of the field facet mirror 13 with the illumination light 3. The whole field facet mirror 13 has an $x_0/y_0$ extent which, depending on the embodiment, for example is 300 mm×300 mm or 600 mm×600 mm. The field individual facets 19 have typical x/y extents of, for example, 25 mm×4 mm, 83 mm×4 mm, 83 mm×6 mm or 104 mm×8 mm. Other dimensions are possible, depending on requirements. Each of the field individual facets 19 has an appropriate number of individual mirrors 21, depending on the ratio between the size of the respective field individual facets 19 and the size of the individual mirrors 21 which make up these field individual facets 19.

For the purposes of an individual deflection of incident illumination light 10, each of the individual mirrors 21 is respectively connected to an actuator 24, as indicated in a dashed fashion in FIG. 2 on the basis of two individual mirrors 21 arranged in a corner bottom left of the overall reflection surface 20 and illustrated in more detail in FIG. 3 on the basis of a section of an individual facet row 22. The actuators 24 are arranged on the side of each of the individual mirrors 21 which faces away from a reflecting side of the individual mirrors 21. By way of example, the actuators 24 can be configured as piezo-actuators. Embodiments of such actuators are known from the design of micro-mirror arrays.

The actuators 24 of an individual mirror row 22 are respectively connected to a row signal bus 26 via signal lines 25. One individual mirror row 22 is associated with respectively one of the row signal buses 26. The row signal buses 26 of the individual mirror rows 22 are in turn connected to a main signal bus 27. The latter has a signal connection to a control device 28 of the field facet mirror 13. The control device 28 is in particular configured for common line-by-line, i.e. row-by-row or column-by-column, actuation of the individual mirrors 21.

Each of the individual mirrors 21 can, individually and independently, be tilted about two tilt axes which are perpendicular to one another, wherein, in particular, a first one of these tilt axes extends parallel to the x-axis and the second one of these two tilt axes extends parallel to the y-axis. In general, the individual mirrors 21 can be tilted in any azimuth in any specific angular range.

Additionally, the actuators 24 also render it possible to displace the individual mirrors 21 individually in the z-direction. Thus, the individual mirrors 21 can be displaced, in a manner in which they are actuatable separately from one another, along a surface normal of the overall reflection surface 20. As a result, it is possible overall to change the topography of the overall reflection surface 20. This is illustrated in an exemplary and very schematic fashion on the basis of FIGS. 4 and 5. As a result, it is also possible to manufacture contours of the overall reflection surface 20 with large sag, i.e. large variations in the topography of the overall reflection surface 20, in the form of mirror sections, arranged in a plane overall, in the style of Fresnel lenses. Moreover, a diffraction structure, in particular diffraction grating, can be formed on the overall reflection surface 20 of the mirror array 13 in this fashion.

Figure 4:

FIG. 4 shows individual reflection surfaces 20a of the individual mirrors 21 of a section of an individual mirror row 22, wherein all individual mirrors 21 of this individual mirror row 22 are set to the same absolute z-position by the control device 28 and the actuators 24. In the case of a completely planar design of the individual mirror reflection surfaces of all individual mirrors 21, this results in a planar row reflection surface of the individual mirror row 22. Correspondingly, it is also possible to achieve a planar column reflection surface of the individual mirror column 23.

FIG. 5 shows an actuation of the individual mirrors 21 of the individual mirror row 22, in which the central individual mirror $21_m$ is set offset in the negative z-direction with respect to neighboring individual mirrors $21_{r1}$, $21_{r2}$, $21_{r3}$. The result of this is a stepped arrangement, which leads to a corresponding phase offset of the illumination light 10 incident on the individual mirror row 22 according to FIG. 5. The phase offset lies at a quarter wavelength, particularly for radiation in the infrared region. The mirror 13 therefore has a so-called λ/4 structure for radiation in the infrared region, in particular for radiation with a wavelength of 10.6 μm. The illumination light 10 reflected by the two central individual mirrors $21_m$ experiences the greatest phase retardation here. The edge-side individual mirrors $21_{r3}$ generate the least phase retardation. The intermediate individual mirrors $21_{r1}$, $21_{r2}$ generate, in a correspondingly stepwise fashion, increasingly less phase retardation proceeding from the phase retardation by the central individual mirrors $21_m$. In particular, the individual mirrors 21 are set in such a way that, for each individual mirror 21, there is at least one further individual mirror 21 such that the individual reflection surfaces of these two individual mirrors 21 are offset by a predetermined offset V in the direction of their surface normals. Here, the offset V is, in particular, in the region of a quarter wavelength in the infrared region. In particular, the offset V lies in the region of 1 μm to 10 μm. In particular, it can be 2.65 μm. However, it is also feasible to arrange individual mirrors 21 in pairs with an offset V deviating therefrom. In general, the offset V is preferably greater than a predetermined wavelength of radiation in the UV region, in particular greater than 100 nm. In particular, the offset V is selected in such a way that the zero order of diffraction of a predetermined wavelength component of the radiation 10 incident on the mirror 13, in particular an infrared component, in particular with a wavelength of 10.6 μm, is cancelled.

FIG. 6 illustrates a further arrangement of the individual mirrors 21. The arrangement of the individual mirrors 21 illustrated in FIG. 6 substantially corresponds to the one from FIG. 3. Here, the individual mirrors $21_f$, $21_b$ are respectively arranged alternating in a front and back position, with these two positions respectively being offset with respect to one another by the predetermined offset V in the direction of the surface normals of the individual mirrors $21_f$, $21_b$. Here, such an offset arrangement can be provided for both the individual mirror rows 22 and for the individual mirror columns 23. The overall reflection surface 20 of the mirror 13 therefore has a checker board-like pattern with front individual mirrors $21_f$ and back individual mirrors $21_b$. Here, all of the individual mirrors 21 can respectively have a planar individual reflection surface. An alternating arrangement of the individual mirrors 21 is also referred to as a binary phase structure or as a binary phase grating. The offset V is also referred to as a groove depth of the phase grid in this case.

In alternative embodiments, the individual mirrors 21 are not adjustable in the z-direction. They are arranged with a predetermined offset pattern, in particular in accordance with the embodiments described with reference to FIGS. 5 and 6. In respect of further details of the arrangeability of the individual mirrors 21 and the advantages emerging therefrom, reference is made to WO 2009/100 856 A1.

In the following text, a further embodiment of the mirror 13 is described with reference to FIG. 7. In the exemplary embodiment in accordance with FIG. 7, the individual reflection surfaces 20a of the individual mirrors 21 of the mirror array 13 respectively have front regions 31 and back regions 32, which are aligned parallel to one another and offset with respect to one another in the direction of their surface normals by a predetermined offset V. In the direction perpendicular to their surface normals, the front regions 31 and the back regions 32 have an identical width. Here, the width of the front regions 31 is also referred to as a web width. The width of the rear regions 32 is also referred to as a groove width. The individual reflection surface 20a of the individual mirror 21 in general comprises at least one such front region 31 and one such back region 32. However, it can also have a multiplicity of such regions 31, 32. In particular, the regions 31, 32 form a grating structure with a grating constant G. Here, this can, in particular, be a binary grating. The grating constant G is also referred to as grating period p.

In particular, the grating constant G is selected in such a way that electromagnetic radiation with wavelengths above those of the illumination light 10 used to image the reticle 7 is diffracted away. In particular, the grating constant G can lie in the infrared region, i.e. in the region between 780 nm and 1 mm. In particular, the grating constant G is at most 5 mm, in particular at most 3 mm, in particular at most 2 mm, in particular at most 1 mm. In particular, it is selected in such a way that the first orders of diffraction of the radiation to be diffracted away are deflected by an angle which corresponds precisely to the diameter of a pupil facet 14a.

The individual mirror 21 has a multi-layer system 34. The multi-layer system 34 is applied onto a substrate 35. The multi-layer system 34 of the individual mirrors 21 forms a reflective coating, in particular for the EUV radiation 10. In particular, the multi-layer system 34 can have a multiplicity of successive silicon/molybdenum double layers.

A further variant of the design of an individual mirror 21 is illustrated in FIG. 8. The design substantially corresponds to the one of the individual mirror 21 in accordance with FIG. 7. However the individual mirror 21 comprises a first grating structure with a first offset $V_1$ and a first grating constant $G_1$ and an additional second grating structure with an offset $V_2$ and a grating constant $G_2$. Both gratings are preferably designed as binary gratings in a self-similar fashion. Here, the second grating structure is configured in such a way that it leads to the destructive cancellation in the zero order of diffraction for at least one further wavelength, which is significantly smaller than for example the wavelength which is cancelled by the first grating structure by destructive interference in the zero order of diffraction. In other words, while destructive interference occurs at the first grating structure with grating constant $G_1$ and offset $V_1$ for infrared radiation—illustrated schematically as IR radiation 36 in FIG. 8—in particular, such long wavelength radiation is not resolved by the second grating structure, while there is destructive interference in particular at the second grating structure with grating constant $G_2$ and offset $V_2$ for electromagnetic radiation in the visible (VIS) and/or UV wavelength region—illustrated schematically as UV/VIS radiation 37 in FIG. 8. The EUV radiation 1 remains at least largely uninfluenced by the two grating structures. This should be understood to mean that the intensity of the orders of diffraction of the EUV radiation 10 is reduced by at most 10%, in particular by at most 5%, in particular by at most 1%, in particular by at most 0.1% by the grating structures.

The individual mirror 21 is therefore provided with a multiple grating structure. In accordance with the embodiment, illustrated in FIG. 8, with a double grating structure, the individual mirror 21 can also be configured with a triple, quadruple, quintuple etc. grating structure.

In respect of further details relating to the grating structure, reference is made to DE 10 2009 044 462 A1.

What applies to all of the exemplary embodiments described above is that the mutually offset regions are respectively separated from one another by an offset edge 41. The offset edge 41 can be formed on a single individual mirror 21 or between two individual mirrors 21. It respectively has an alignment in a specific direction. In this case, it is advantageous if the offset edges 41 are aligned in such a way that the projection thereof along the optical axis of the illumination optical unit 4 extends obliquely into the object field 5, in particular perpendicular to the scanning direction.

It can also be advantageous to align one part of the offset edges 41 in a first direction and to align a further part of the offset edges 41 in a second direction which deviates therefrom.

In principle, it is also possible to align a portion of 50% of the offset edges 41 in such a way that the projection thereof in the object plane 6 is parallel to the x-direction while the other 50% of the offset edges 41 are aligned in such a way that the projection thereof in the object plane 6 extends parallel to the y-direction.

It is possible to embody the mirror array with individual mirrors 21 in accordance with a plurality of the above-described embodiments. In particular, it is possible to embody the mirror array in such a way that some of the individual mirrors 21, for example at least 10%, in particular at least 30%, in particular at least 50%, in particular at least 70%, have an individual reflection surface 20a with a planar design, while the remaining individual mirrors 21 respectively have one or more offset edges 41.

The mirror array can also have both an offset structure and a diffraction structure.

In respect of further details relating to the displaceability of the individual mirrors 21 of the mirror array and relating to setting a predetermined illumination setting, reference is made to WO 2009/100 856 A1 or DE 10 2008 009 600 A1.

Above, the offset structure was described for a mirror array with a multiplicity of individual mirrors 21. However, it is likewise possible to embody the field facets 13a of the field facet mirror 13 as individual facets, i.e. as facets not composed of a multiplicity of individual mirrors 21. They can nevertheless be provided with an appropriate diffraction structure for diffracting radiation with a wavelength in the infrared region. As described above, the groove depth d of the phase grating is selected in such a way that it just corresponds to a quarter of a wavelength $\lambda_{ex}$ to be blocked out. The wavelength $\lambda_{ex}$ to be blocked out is, in particular, the wavelength of a laser which is used to generate the plasma in the EUV radiation source 3.

In particular, the phase grating has webs and grooves with identical width.

The grating period p is selected in such a way that the deflection angle for the first orders of diffraction of the radiation to be diffracted away lies in a region such that the images of the $1^{st}$ and $-1^{st}$ orders of diffraction respectively fall on pupil facets 14a which lie adjacent to the pupil facet 14a on which the image of the illumination radiation 10 comes to rest. This image is also referred to as specula reflection. In this respect, it should be noted that the illumination radiation 10 has a coherence width which is less than the grating period p by at least one order of magnitude. In particular, the coherence width of the illumination radiation lies in the region of 5 μm to 20 μm. For clarification purposes, the first orders of diffraction are denoted by the reference sign 42 in FIGS. 9 and 10.

In principle, it is also possible to select the grating period p in such a way that the images of the $1^{st}$ and $-1^{st}$ orders of diffraction fall on pupil facets 14a which lie further away from the pupil facet 14a on which the image of the zero order of diffraction of the illumination radiation 10 comes to rest. In principle, it is also feasible to diffract the infrared radiation to such a large extent that it is no longer incident at all on the pupil facet mirror 14.

In particular, the deflection angle lies in the region from 3 mrad to 10 mrad, in particular in the region from 5 mrad to 7 mrad.

The field facets 13a have an aspect ratio of at least 5:1, in particular of at least 8:1, in particular of at least 13:1. The field facet 13a illustrated in FIG. 11 in an exemplary fashion has an arc-shaped design. It has a dimension of approximately 80 mm in the x-direction. The dimension in the y-direction, i.e. parallel to the scanning direction, is approximately 4 mm. In the case of such an embodiment of the field facet 13a, the phase grating is preferably aligned orthogonally with respect to the long side. However, as described above, the phase grating can be aligned at a slight angle with respect to the scanning direction.

While the phase grating is suitable for diffracting undesired infrared radiation 36, it can have an adverse effect on the uniformity of the illumination of the object field 5. The same applies to the structure of the field facet mirror 13, which is formed by the subdivision into individual mirrors 21. There can be interfering spatial frequencies in the illumination of the object field 5 as a result of the not continuously differentiable transitions between neighboring individual mirrors 21.

Therefore, provision is made according to a further aspect of the invention for the pupil facets 14a to be provided with a mechanism for damping spatial frequencies above a specific limit frequency. The effect of such a configuration of the pupil facet mirror 14 is illustrated schematically in FIGS. 12 and 13. While a structure on the field facets 13a with spatial frequencies of the order of 1 mm$^{-1}$ can lead to variations in the intensity of the illumination radiation 10 in the region of the object field 5, in particular in the x-direction, i.e. perpendicular to the scanning direction, such variations in the intensity can be damped or smoothed by a suitable configuration of the pupil facets 14a.

In order to damp spatial frequencies, the pupil facets 14a can in particular be provided with a scattering function such that the scattered intensity I has an angular distribution I($\alpha$). In particular, this is a one-dimensional scattering function. It is preferably configured in such a way that it influences the illumination of the object field 5 in the x-direction, i.e. in the cross-scan direction, only. The precise definition of the scattering function depends on the spatial frequencies to be damped, i.e., in particular, on the structure on the field facet mirror 13. In one exemplary embodiment, configuring the scattering function as a one-dimensional Gaussian function with a scattering angle $\sigma$ of 0.4 mrad was found to be advantageous. In particular, the angular distribution of the scattered intensity I($\alpha$) has the following form:

$$I(\alpha) = I_0 \left( \frac{1}{\sqrt{2\pi\sigma^2}} e \right)^{-\frac{\alpha^2}{2\sigma^2}}.$$

As a result, a TIS (total integrated scatter) of 100% follows, since $$\int_{-\frac{\pi}{2}}^{\frac{\pi}{2}} d\alpha I(\alpha) = I_0,$$

where $I_0$ is power or intensity incident on the pupil facet. Using this, it was possible to damp spatial frequencies of more than 1.33 mm$^{-1}$ to a contrast of less than 0.01% in the region of the image field 5.

This scattering function could be realized by directly writing one-dimensional cylinders into the pupil facets 14a. In other words, the pupil facets 14a respectively have a reflection surface 43 which is composed of cylindrical surface sections. In particular, the cylinders are aligned parallel to one another. They are arranged rotated with respect to the y-direction by an angle c. In particular, the angle c lies in the region of 0° to 15°, in particular in the region of 5° to 10°.

The cylinders have a circular cylindrical design. They have a uniform radius of curvature R. They have different widths $b_i$, i.e. different central angles m. The widths $b_i$ of the cylinders are also referred to as pitches. By combining a plurality of different pitches, the scattering function, in particular the Gaussian function, can be approximated. To this end, the Gaussian function to be approximated can be decomposed into for example N=10 steps with unchanging intensity level. Subsequently, it is possible to determine the widths $b_i$ of the cylinders, given a predetermined radius of curvature R. The sum of these N=10 pitches is also referred to as patch.

An approximation of the scattering function by N=10 patches is illustrated in an exemplary fashion in FIG. 15. Here, each of the horizontal bars corresponds to the scattering profile of an individual cylinder. The scattering angle plotted on the x-axis can, in the case of a given radius of curvature R, be directly converted into a width $b_i$ of the corresponding cylinder.

A plurality of patches are preferably housed on a pupil facet 14a. In the process, the sequence of the cylinders is preferably permuted.

The construction data of a patch with N=10 pitches, a radius of curvature of R=50 mm and an overall width $b_{Ges}$=250 μm is specified in the following table.

| Pitch number | Width [μm] | Sag [μm] |
| --- | --- | --- |
| 1 | 43.7986 | 0.00479579 |
| 2 | 36.9296 | 0.0034095 |
| 3 | 32.2401 | 0.00259857 |
| 4 | 28.4479 | 0.0020232 |
| 5 | 25.1151 | 0.00157691 |
| 6 | 22.0206 | 0.00121227 |
| 7 | 19.0155 | 0.00090397 |
| 8 | 15.9613 | 0.000636907 |
| 9 | 12.6703 | 0.000401341 |
| 10 | 8.73202 | 0.00019062 |

As an alternative to pitches with a uniform radius of curvature R and patches comprising different widths $b_i$, the pitches can also have different radii of curvature $R_i$ and a uniform width b or different radii of curvature $R_i$ and different widths $b_i$.

In place of a surface which cannot be continuously differentiated, the pupil facets 14a can also be provided with a smooth, periodic structure.

Alternatively, a scattering effect of the pupil facets 14a can also be introduced via a roughness profile. In respect of details, reference is made to EP 1 796 147 A1.

In order to damp spatial frequencies, the pupil facets 14a can also be provided with targeted defocusing. In respect of details, reference is made to U.S. Pat. No. 7,006,595 B2. The pupil facets 14a are preferably only defocused in the cross-scan direction. This can be achieved, in particular, via a toroidal design of the pupil facets 14a. In respect of details of toroidal pupil facets, reference is made to EP 1 811 547 A1.

Finally, it is also possible to introduce a targeted power spectral density (PSD) onto the surface of the pupil facets 14a which results in a corresponding scattering function. This is understood to mean that the surface of the pupil facets 14a is roughened, in particular roughened in an anisotropic fashion. This renders it possible to achieve a targeted reflectance distribution function, in particular a targeted bidirectional reflectance distribution function (BRDF).

In respect of overexposure of the object field 5 to be illuminated, reference is made to the fact that the object field to be illuminated is usually overexposed in the cross-scan direction in any case. Edge smearing by defocusing or a scattering function therefore does not necessarily lead to relatively large overexposure and system transmissions connected therewith. If need be, this can be taken into account when designing the scattering function, in particular the gradient of same in the edge region.

An embodiment of the pupil facets 14a with a mechanism for damping spatial frequencies, in particular an embodiment of the pupil facets 14a with a scattering function can be advantageous, independently of the design of the field facet mirror 13. As a result of an appropriate configuration of the pupil facet mirror 14, the stability of the illumination system and/or the uniformity of the illumination of the object field 5 in particular can be improved.

The combination of a field facet mirror 13 with a diffraction structure for diffracting radiation with a wavelength in the infrared region and a pupil facet mirror 14 with a scattering function was found to be particularly advantageous.

With the aid of the projection exposure apparatus 1, at least part of the reticle in the object field 5 is imaged on a region of a light-sensitive layer on the wafer in the image field 8 for the lithographic production of a microstructured or nanostructured component, in particular of a semiconductor component, for example a microchip. Depending on whether the projection exposure apparatus 1 is embodied as a scanner or as a stepper, the reticle and the wafer are displaced in the y-direction in a temporally synchronized fashion, either continuously in the scanning operation or in a step-by-step fashion in the stepper operation.

The invention claimed is:

1. A pupil facet mirror, comprising:
a multiplicity of pupil facets respectively configured to damp spatial frequencies above 1 mm$^{-1}$,
wherein:
the pupil facets comprise at least one member selected from the group consisting of a targeted defocusing in a cross-scan direction only and a scattering function configured to damp spatial frequencies;
pupil facets comprise one dimensional cylinders configured to provide the scattering function;
the one dimensional cylinders are aligned parallel to each other;
the cylinders have a property selected from the group consisting of a uniform radius of curvature and different widths, different radii of curvature and a uniform width b, and different radii of curvature and different widths; and
the pupil facet mirror is a microlithography pupil facet mirror.

2. The pupil facet mirror of claim 1, wherein, for at least some of the pupil facets, the pupil facet comprises a scattering function configured to damp the spatial frequencies above the specific limit frequency.

3. The pupil facet mirror of claim 2, wherein the scattering function is a one-dimensional scattering function.

4. The pupil facet mirror of claim 2, wherein the scattering function has a scattering angle of at least 0.1 mrad.

5. An illumination optical unit, comprising:
a first facet mirror comprising a structure having a spatial frequency of at least 0.2 mm$^{-1}$ in at least one dimension; and
a pupil facet mirror according to claim 1,
wherein the illumination optical unit is a microlithography illumination optical unit.

6. The illumination optical unit of claim 5, wherein mechanisms to damp the spatial frequencies of the pupil facets of the pupil facet mirror are matched to the structure of the facets of the first facet mirror so the spatial frequencies of the structure have a contrast of at most 1% in a region of an object field.

7. The illumination optical unit of claim 5, wherein the structure of the first facet mirror defines a binary phase grating.

8. The illumination optical unit of claim 7, wherein the binary phase grating has a groove depth corresponding to a quarter of a wavelength of radiation to be blocked out.

9. The illumination optical unit of claim 7, wherein the binary phase grating has a grating period matched to a configuration of the pupil facets of the pupil facet mirror so that, during use of the illumination optical unit, the 1$^{st}$ and $-1^{st}$ order of diffraction of radiation with a wavelength to be blocked out is imaged on pupil facets of the pupil facet mirror that lie adjacent to a facet on which the image of the radiation rests.

10. An illumination optical unit, comprising:
a pupil facet mirror according to claim 1,
wherein the illumination optical unit is a microlithography illumination optical unit.

11. An illumination system, comprising:
an EUV radiation source; and
an illumination optical unit comprising a pupil facet mirror according to claim 1.

12. The illumination system of claim 11, wherein the illumination optical unit comprises an additional facet mirror comprising a structure having a spatial frequency of at least 0.2 mm$^{-1}$ in at least one dimension.

13. An apparatus, comprising:
an illumination optical unit comprising a pupil facet mirror according to claim 1; and
a projection optical unit,
wherein the apparatus is a microlithography projection exposure apparatus.

14. The apparatus of claim 13, wherein the illumination optical unit comprises an additional facet mirror comprising a structure having a spatial frequency of at least 0.2 mm$^{-1}$ in at least one dimension.

15. A method of using a projection exposure apparatus comprising an illumination optical unit and a projection optical unit, the method comprising:
using the illumination optical unit to illuminate structures of a reticle in an object plane of the projection optical unit; and
using the projection optical unit to project at least some of the illuminated structures of the reticle onto a light-sensitive material in an image plane of the projection optical unit,
wherein the illumination optical unit comprises a pupil facet mirror according to claim 1.

16. The pupil facet mirror of claim 1, wherein radii of curvature of the pupil facets are configured to provide the targeted defocusing.

17. The pupil facet mirror of claim 1, wherein the pupil facets are respectively configured to damp spatial frequencies above 1.33 mm$^{-1}$.

18. A pupil facet mirror, comprising:
a multiplicity of pupil facets respectively configured to damp spatial frequencies above 1 mm$^{-1}$,
wherein:
the pupil facets comprise at least one member selected from the group consisting of a targeted defocusing in a cross-scan direction only and a scattering function configured to damp spatial frequencies;
pupil facets comprise one dimensional cylinders configured to provide the scattering function;
the one dimensional cylinders are aligned parallel to each other;

the cylinders are rotated by an angle in the region of 0° to 15° relative to a direction parallel to a scanning direction; and the pupil facet mirror is a microlithography pupil facet mirror.

19. The pupil facet mirror of claim 18, wherein, for at least some of the pupil facets, the pupil facet comprises a scattering function configured to damp the spatial frequencies above the specific limit frequency.

20. The pupil facet mirror of claim 19, wherein the scattering function is a one-dimensional scattering function.

21. The pupil facet mirror of claim 19, wherein the scattering function has a scattering angle of at least 0.1 mrad.

22. An illumination optical unit, comprising:

a first facet mirror comprising a structure having a spatial frequency of at least 0.2 mm$^{-1}$ in at least one dimension; and a pupil facet mirror according to claim 18, wherein the illumination optical unit is a microlithography illumination optical unit.

23. An illumination optical unit, comprising:

a pupil facet mirror according to claim 18, wherein the illumination optical unit is a microlithography illumination optical unit.

24. An illumination system, comprising:

an EUV radiation source; and an illumination optical unit comprising a pupil facet mirror according to claim 18.

* * * * *

UNITED STATES PATENT AND TRADEMARK OFFICE
CERTIFICATE OF CORRECTION

PATENT NO. : 10,599,041 B2
APPLICATION NO. : 14/529844
DATED : March 24, 2020
INVENTOR(S) : Bieling et al.

Page 1 of 1

It is certified that error appears in the above-identified patent and that said Letters Patent is hereby corrected as shown below:

In the Specification

Column 2, Line 62, delete "mm" and insert -- mm. --;

Column 3, Line 23, delete "the a" and insert -- the --.

Signed and Sealed this
Eighteenth Day of August, 2020

Andrei Iancu
*Director of the United States Patent and Trademark Office*